US012587181B2

(12) United States Patent (10) Patent No.: US 12,587,181 B2
van der Cammen (45) Date of Patent: Mar. 24, 2026

(54) CLOCK SIGNAL CIRCUITS

(71) Applicant: NXP B.V., Eindhoven (NL)

(72) Inventor: Peter van der Cammen, Delft (NL)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 18/654,098

(22) Filed: May 3, 2024

(65) Prior Publication Data

US 2024/0396539 A1 Nov. 28, 2024

(30) Foreign Application Priority Data

May 23, 2023 (EP) ...................................... 23174804

(51) Int. Cl.
H03K 5/135 (2006.01)
(52) U.S. Cl.
CPC .................................... H03K 5/135 (2013.01)
(58) Field of Classification Search
CPC ..... H03K 5/135; H03K 3/012; H03K 3/35613
See application file for complete search history.

(56) References Cited

U.S. PATENT DOCUMENTS

| | | | |
|---|---|---|---|
| 4,140,927 A | 2/1979 | Feucht | |
| 5,047,659 A | 9/1991 | Ullrich | |
| 5,818,276 A | 10/1998 | Garrity et al. | |
| 6,445,224 B1 | 9/2002 | Fong | |
| 6,492,847 B1 | 12/2002 | Goetz et al. | |
| 6,958,628 B2 | 10/2005 | Zanchi | |

| | | | |
|---|---|---|---|
| 7,170,351 B2 | 1/2007 | Shimatani | |
| 11,075,629 B2 | 7/2021 | Agnes | |
| 2016/0277014 A1* | 9/2016 | Yang .................... | H03K 5/1515 |
| 2018/0076805 A1* | 3/2018 | Paul .................... | H03K 5/1565 |

(Continued)

FOREIGN PATENT DOCUMENTS

| | | |
|---|---|---|
| JP | H04207216 A | 7/1992 |
| JP | 2005124120 A | 5/2005 |
| KR | 102010078881 A | 7/2010 |

OTHER PUBLICATIONS

Figueiredo, M., "Improved Clock-Phase Generator based on Self-biased CMOS Logic for Time-Interleaved SC circuits", 2009 16th IEEE International Conference on Electronics, Circuits and Systems (ICECS—2009), Dec. 13-16, 2009.

(Continued)

*Primary Examiner* — Sibin Chen

(57) ABSTRACT

The disclosure relates to clock signal circuits for generating non-overlapping output clock signals. Example embodiments include a clock signal circuit (100) for generating first and second non-overlapping output clock signals ($\varphi 1p$, $\varphi 2n$), the clock signal circuit (100) comprising: first and second PMOSFETs (M1, M3); first and second NMOSFETs (M2, M4); a clock signal input node (101) connected to a gate of the first PMOSFET (M1) and a gate of the second NMOSFET (M4); a first voltage rail (102) connected to a source of the first PMOSFET (M1); a second voltage rail (103) connected to a source of the second NMOSFET (M4); a first clock signal output node (104) connected to a drain of the first PMOSFET (M1), a drain of the first NMOSFET (M2) and a source of the second PMOSFET (M3); and a second clock signal output node (105) connected to a drain of the second PMOSFET (M3), a source of the first NMOSFET (M2) and a drain of the second NMOSFET (M4).

19 Claims, 8 Drawing Sheets

(56)     References Cited

U.S. PATENT DOCUMENTS

2019/0074825  A1 *   3/2019  Hwang  ............ H03K 3/356104
2020/0042289  A1 *   2/2020  Wang  ...................... G06F 7/588

OTHER PUBLICATIONS

Kumar, C., "An Efficient Two-Phase NOC Generator for Low Frequency Applications", 2014 IEEE International Conference on Advanced Communication Control and Computing Technologies (ICACCCT), May 8-10, 2014.
Nowacki, B., "A Simple 1 GHz Non-Overlapping Two-Phase Clock Generators for SC Circuits", MIXDES 2013, 20th International Conference "Mixed Design of Integrated Circuits and Systems", Jun. 20-22, 2013.
Suvakovic, D., "Wp 22.2 Two Phase Non-Overlapping Clock Adiabatic Differential Cascode Voltage Switch Logic (ADCVSL)", 2000 IEEE International Solid-State Circuits Conference, Feb. 9, 2000.

* cited by examiner

Fig. 8

CLOCK SIGNAL CIRCUITS

CROSS-REFERENCE TO RELATED APPLICATIONS

This application claims the priority under 35 U.S.C. § 119 of European Patent application no. 23174804.7, filed on 23 May 2023, the contents of which are incorporated by reference herein.

FIELD

The disclosure relates to clock signal circuits for generating non-overlapping output clock signals.

BACKGROUND

In switched capacitor circuits, the switches are often controlled in two phases. Either a switch is closed in phase one (phase 1 switch) and open in phase two or the other way around (phase 2 switch). It is important that there is no overlap in the closure of these switches. A phase 1 switch may only be closed when all phase 2 switches are opened and the other way around. For that purpose, a two phase non overlapping clock circuit has to be added. Since a switch can either be realized with an NMOS transistor or a PMOS transistor, the requirements for this non overlapping clock circuit depend on the implementations of the switch.

When all switches are NMOS, a phase 1 switch may only be closed when all phase 2 switch are opened, meaning that the signal that drives the gate of an NMOS switch 1 can only go high when the corresponding signals for all NMOS switches 2 are low and vice versa. The gate voltage of the two types of NMOS switches may never be high at the same time.

When all switches are of the PMOS type we obtain a similar requirement, i.e. the gate voltages of the two types of PMOS switches may never be low at the same time.

When both types are used, the NMOS switch gate signal can only go high when the PMOS gate signal is already high and the PMOS gate signal can only go low when the gate of the NMOS is already low.

A clock signal source has to be converted into two non-overlapping signals that drive the gates of the switching transistors. Techniques such as incorporating delays and logic gates in the two phase clock signal path may be used such that the switches that are to be connected at the outputs of the circuit are not closed at the same time. Such solutions tend to be sub-optimal. Delays and propagation times of clock signals from the clock signal source to the gates of the switching transistors will tend to have some unpredictable properties like process dependence, supply voltage and temperature dependence. For that reason, the designer often has to include a certain extra time margin between the moments that the phase 1 switches are opened and the phase 2 switches are closed and vice versa. This extra time margin is disadvantageous when fast switched capacitor circuits have to be implemented, where we want to close a switch as soon as possible and not wait an extra time in order to prevent an accidental overlap in the switch closures that may occur in some extreme situations.

SUMMARY

According to a first aspect there is provided a clock signal circuit for generating first and second non-overlapping output clock signals, the clock signal circuit comprising:

first and second PMOSFETS;
first and second NMOSFETS;
a clock signal input node connected to a gate of the first PMOSFET and a gate of the second NMOSFET;
a first voltage rail connected to a source of the first PMOSFET;
a second voltage rail connected to a source of the second NMOSFET;
a first clock signal output node connected to a drain of the first PMOSFET, a drain of the first NMOSFET and a source of the second PMOSFET; and
a second clock signal output node connected to a drain of the second PMOSFET, a source of the first NMOSFET and a drain of the second NMOSFET.

An advantage of clock signal circuits disclosed herein is that an extra delay to accommodate for uncertain properties is not required.

In some examples the clock signal input may be connected to a gate of the first NMOSFET and a gate of the second PMOSFET.

In some examples the clock signal circuit further comprises:
a third PMOSFET having a gate connected to the first clock signal output node, a source connected to the first voltage rail and a drain connected to an output node; and
a third NMOSFET having a gate connected to the second clock signal output node, a source connected to the second voltage rail and a drain connected to the output node.

In some examples the clock signal circuit further comprises:
third and fourth PMOSFETS;
third and fourth NMOSFETs;
an inverted clock signal input node connected to a gate of the third PMOSFET and a gate of the fourth NMOSFET;
a third clock signal output node connected to a drain of the third PMOSFET, a drain of the third NMOSFET and a source of the fourth PMOSFET; and
a fourth clock signal output node connected to a drain of the fourth PMOSFET, a source of the third NMOSFET and a drain of the fourth NMOSFET.

The first voltage rail may be connected to a source of the third PMOSFET, and the second voltage rail connected to a source of the fourth NMOSFET.

The first clock signal output node may be connected to a gate of the third NMOSFET, the second clock signal output node connected to a gate of the fourth PMOSFET, the third clock signal output node connected to a gate of the first NMOSFET, and the fourth clock signal output node connected to a gate of the second PMOSFET.

The clock signal circuit may comprise an inverter having an input connected to the clock signal input node and an output connected to the inverted clock signal input node.

In some examples the clock signal circuit comprises fifth and sixth PMOSFETs connected between the first voltage rail and the first and third PMOSFETs respectively, wherein the first voltage rail is connected to sources of the fifth and sixth PMOSFETs, a drain of the fifth MOSFET is connected to the source of the first PMOSFET, a drain of the sixth PMOSFET is connected to the source of the third PMOSFET, a gate of the fifth PMOSFET is connected to the third clock signal output node, and a gate of the sixth PMOSFET is connected to the first clock signal output node.

The clock signal input node may be connected to gates of the first NMOSFET and the second PMOSFET, and the inverted clock signal input node connected to the gates of the fourth PMOSFET and the third NMOSFET.

In some examples the clock signal circuit comprises fifth and sixth NMOSFETS connected between the second voltage rail and the second and fourth NMOSFETs respectively, wherein the second voltage rail is connected to sources of the fifth and sixth NMOSFETs, a drain of the fifth PMOSFET is connected to the source of the second NMOSFET, a drain of the sixth NMOSFET is connected to the source of the fourth NMOSFET, a gate of the fifth NMOSFET is connected to the fourth clock signal output node, and a gate of the sixth NMOSFET is connected to the second clock signal output node.

The clock signal input node may be connected to gates of the first NMOSFET and the second PMOSFET, and the inverted clock signal input node connected to the gates of the fourth PMOSFET and the third NMOSFET.

The clock signal circuit may comprise an inverter having an input connected to the clock signal input node and an output connected to the inverted clock signal input node.

The first voltage rail may be a supply voltage rail and the second voltage rail a common rail.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which:

FIG. 8 is a schematic circuit diagram of a fifth example clock signal circuit.

Figure 1:
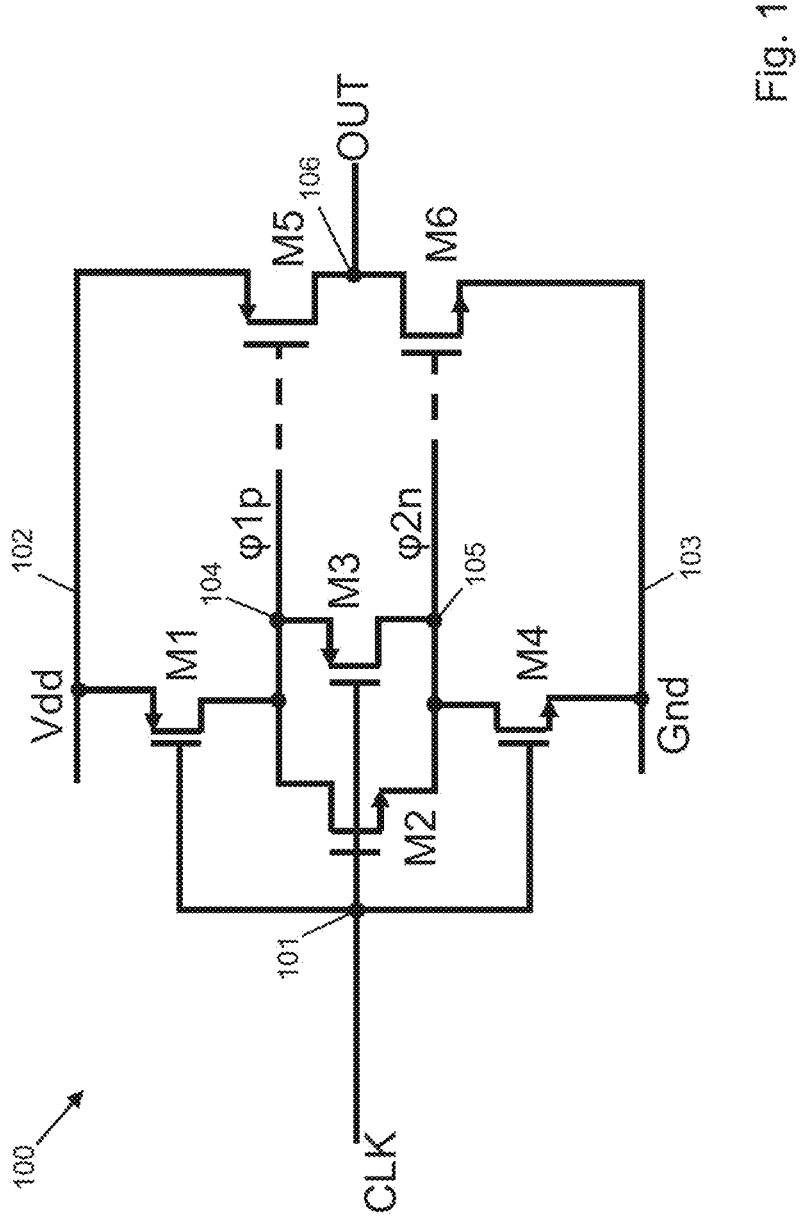
FIG. 1 is a schematic circuit diagram of a first example clock signal circuit.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1

FIG. 1 illustrates an example clock signal circuit 100 for generating first and second non-overlapping output clock signals $\varphi 1p$, $\varphi 2n$ at respective first and second clock signal output nodes 104, 105 from an input clock signal CLK provided at a clock signal input node 101. Two output transistors M5, M6 are provided to drive a load, which is connected to an output node 106. When an inverter is used for this, there will always be a certain amount of current flowing from the supply Vdd to ground Gnd when the output is changing state from low to high or vice versa. Especially when large MOS transistors are used in order to drive large loads, this 'short circuit' current can be substantial and will decrease efficiency. The non overlap circuit provided by transistors M1 to M4 will prevent this, resulting in an output transistor only being 'switched on' when the other is 'switched off'. The circuit 100 can therefore be used as a digital output driver for large loads with high power efficiency.

The clock signal circuit 100 comprises first and second PMOSFETs M1, M3 and first and second NMOSFETs M2, M4. The clock signal input node 101 is connected to a gate of the first PMOSFET M1 and a gate of the second NMOSFET M4. In this example the clock signal input node 101 is also connected to a gate of the first NMOSFET M2 and a gate of the second PMOSFET M3.

A first voltage rail 102, which in this case is a supply voltage rail providing a supply voltage Vdd, is connected to a source of the first PMOSFET M1. A second voltage rail 103, which in this case is a common or ground rail, is connected to a source of the second NMOSFET M4.

The first clock signal output node 104 is connected to a drain of the first PMOSFET M1, a drain of the first NMOSFET M2 and a source of the second PMOSFET M3.

The second clock signal output node 105 is connected to a drain of the second PMOSFET M3, a source of the first NMOSFET M2 and a drain of the second NMOSFET M4.

In the output driver circuit, a third PMOSFET M5 has a gate connected to the first clock signal output node 104, a source connected to the first voltage rail 102 and a drain connected to the output node 106. A third NMOSFET M6 has a gate connected to the second clock signal output node 105, a source connected to the second voltage rail 103 and a drain connected to the output node 106.

FIG. 2

When both NMOS and PMOS transistors are used for phase 1 as well as phase 2 switches (for instance when transmission gates are used), the demands of the clock signal circuit become more complicated, in that: i) the NMOS phase 1 transistor gates may only go high when the NMOS phase 2 transistor gates are low and the PMOS phase 2 transistor gates are high; ii) the NMOS phase 2 transistor gates may only go high when the NMOS phase 1 transistor gates are low and the PMOS phase 1 transistor gates are high; iii) the PMOS phase 1 transistor gates may only go low when the PMOS phase 2 transistor gates are high and the NMOS phase 2 transistor gates are low; and iv) the PMOS phase 2 transistor gates may only go low when the PMOS phase 1 transistor gates are high and the NMOS phase 1 transistor gates are low. The second example clock signal circuit 200 illustrated in FIG. 2 addresses these demands.

As with the first example clock signal circuit 100 of FIG. 1, the second example clock signal circuit 200 comprises first and second PMOSFETs M1', M3' and first and second NMOSFETs M2', M4'. The clock signal input node 201 is connected to a gate of the first PMOSFET M1' and a gate of the second NMOSFET M4'.

The first voltage rail 102, which in this case is a supply voltage rail providing a supply voltage Vdd, is connected to a source of the first PMOSFET M1'. The second voltage rail 103, which in this case is a common or ground rail, is connected to a source of the second NMOSFET M4'.

The first clock signal output node 204 is connected to a drain of the first PMOSFET M1', a drain of the first NMOSFET M2' and a source of the second PMOSFET M3'.

The second clock signal output node 205 is connected to a drain of the second PMOSFET M3', a source of the first NMOSFET M2' and a drain of the second NMOSFET M4'.

The clock signal circuit 200 further comprises third and fourth PMOSFETs M5', M6' and third and fourth NMOSFETs M7', M8'. An inverted clock signal input node 202 is connected to a gate of the third PMOSFET M5' and to a gate of the fourth NMOSFET M8'.

A third clock signal output node 206 is connected to a drain of the third PMOSFET M5', a drain of the third NMOSFET M7' and a source of the fourth PMOSFET M6'.

A fourth clock signal output node 207 is connected to a drain of the fourth PMOSFET M6', a source of the third NMOSFET M7' and a drain of the fourth NMOSFET M8'.

The first voltage rail 102 is connected to a source of the third PMOSFET M5'. The second voltage rail 103 is connected to a source of the fourth NMOSFET M8'.

The first clock signal output node 204 is connected to a gate of the third NMOSFET M7'. The second clock signal output node 205 is connected to a gate of the fourth PMOSFET M6'. The third clock signal output node 206 is connected to a gate of the first NMOSFET M2'. The fourth clock signal output node 207 is connected to a gate of the second PMOSFET M3'.

Figure 2:
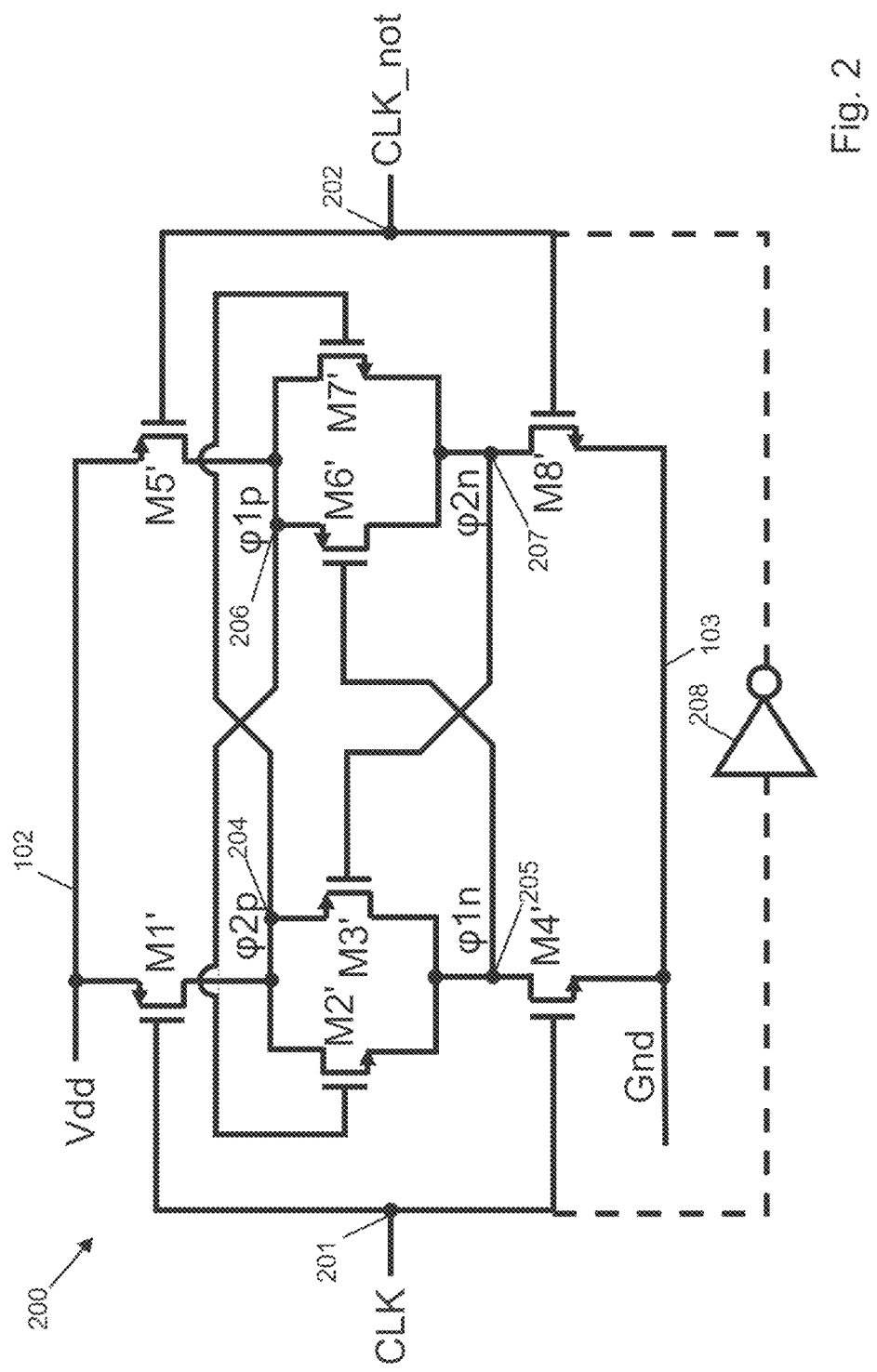
FIG. 2 is a schematic circuit diagram of a second example clock signal circuit.

In the second example clock signal circuit 200 of FIG. 2, an optional inverter 208 is shown having an input connected to the clock signal input node 201 and an output connected to the inverted clock signal input node 202.

When the clock signal CLK changes state, this will directly result in switches M1', M4', M5' and M8' switching such that: i) $\varphi1_n$ goes low as soon as CLK goes high; ii) $\varphi$n will go low as soon as CLKnot goes high; iii) $\varphi1_p$ will go high as soon as CLKnot goes low; and iv) $\varphi2_p$ will go high as soon as CLK goes low. Furthermore: i) $\varphi1_n$ goes high only when and $\varphi2_p$ is high and $\varphi2_n$ is low; ii) $\varphi2_n$ goes high only when and $\varphi1_p$ is high and $\varphi1_n$ is low; iii) $\varphi1_p$ goes low only when and $\varphi2_n$ is low and $\varphi2_p$ is high; and iv) $\varphi2_p$ goes low only when and $\varphi1_n$ is low and $\varphi1_p$ is high.

FIG. 3

Figure 3:
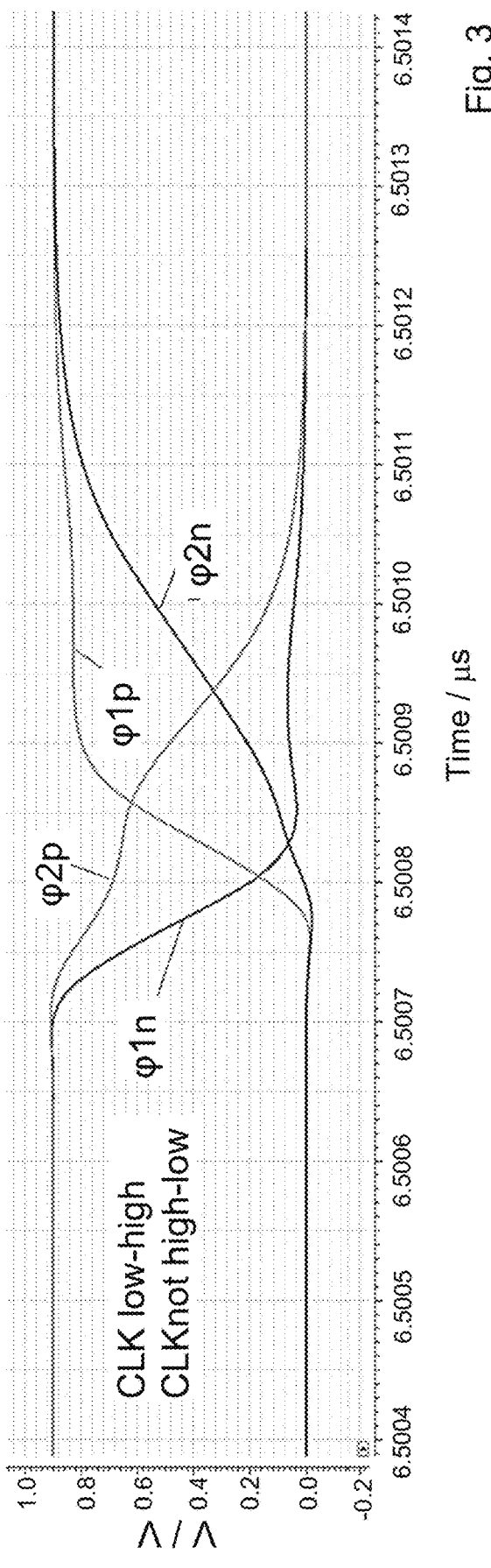
FIG. 3 is a plot of clock phase output signals of the second example clock signal circuit over a clock transition.

One possible drawback of the clock signal circuit of FIG. 2 is that when CLK goes from low to high and $\varphi1_n$ is pulled to ground directly while $\varphi2_p$ is still high and $\varphi2_n$ is still low, $\varphi2_p$ will be discharged somewhat by transistor M3'. This is illustrated in the waveforms shown in FIG. 3, which shows the transitions for the four clock signal outputs in the transition from CLK high and CLKnot low to CLK low and CLKnot high. This does not have to be a problem when low supply voltages are used. The voltage drop of $\varphi2_p$ will then not be enough to open the connected phase 2 PMOS switches. A similar thing happens with the $\varphi2_n$ signal.

FIG. 4

Figure 4:
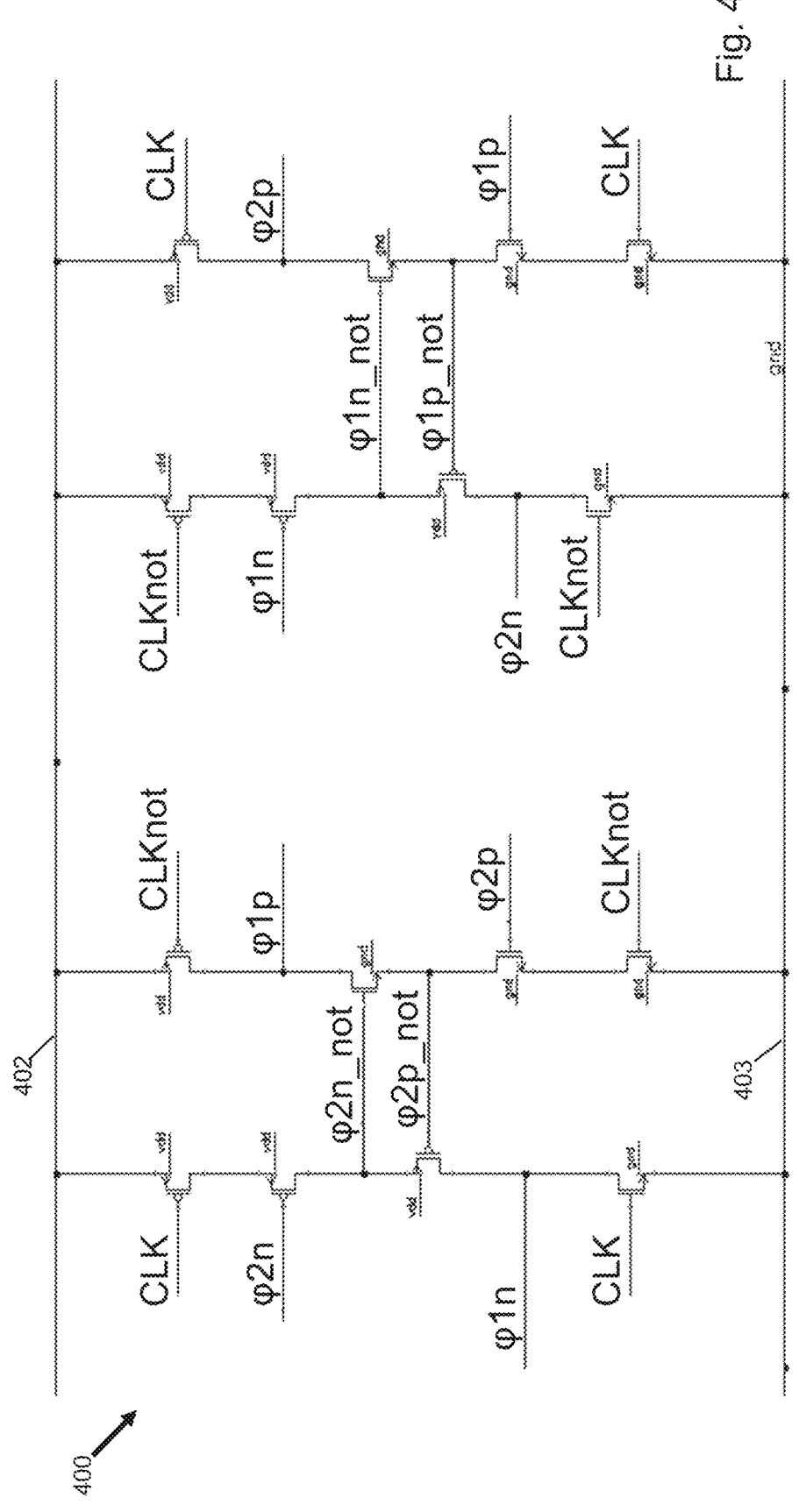
FIG. 4 is a schematic circuit diagram of a third example clock signal circuit.

The third example circuit 400 illustrated in FIG. 4 has more complexity but does not have the above mentioned drawback. In this example: i) $\varphi1_n$ will go low as soon as CLK goes high; ii) $\varphi2_n$ will go low as soon as CLKnot goes high; iii) $\varphi1_p$ will go high as soon as CLKnot goes low; and iv) $\varphi2_p$ will go high as soon as CLK goes low.

Only when these switches are all open (by checking the gate voltage of these transistors), the circuit will start closing switches, such that: i) $\varphi1_n$ goes high only when and $\varphi2_p$ is high and $\varphi2_n$ is low (and CLK is low); ii) $2n$ goes high only when and $\varphi1_p$ is high and $\varphi1_n$ is low (and CLKnot is low); iii) $1_p$ goes low only when and $\varphi2_n$ is low and $\varphi2_p$ is high (and CLKnot is high); and iv) $\varphi2_p$ goes low only when and $\varphi1_n$ is low and $\varphi1_p$ is high (and CLK is high).

FIG. 5

Figure 5:
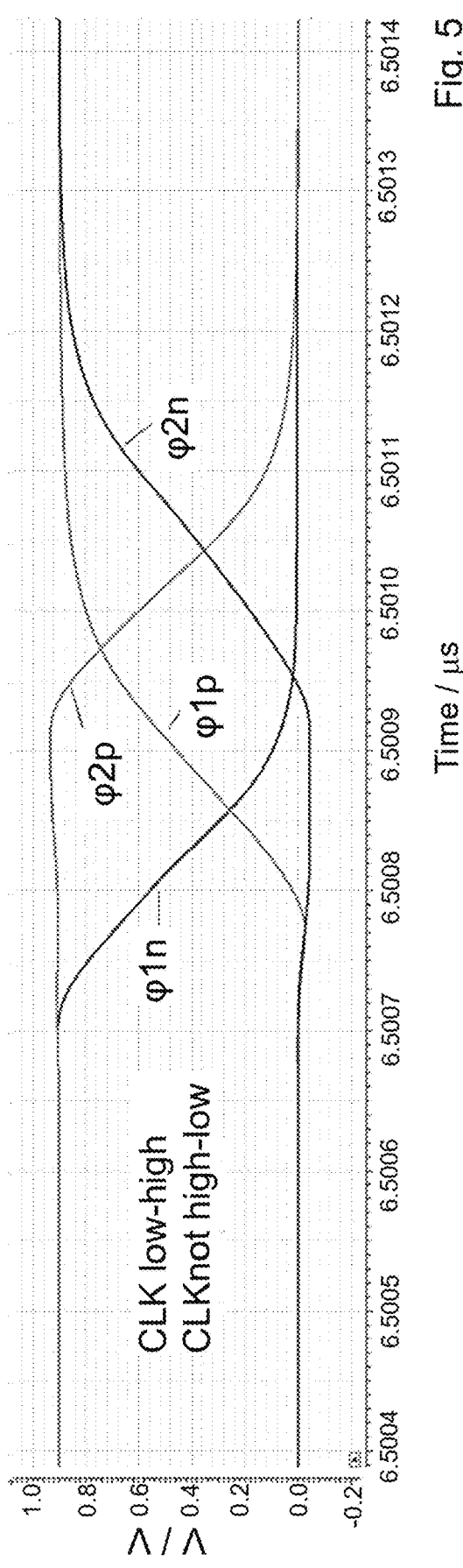
FIG. 5 is a plot of clock phase output signals of the third example clock signal circuit over a clock transition.

Example waveforms of the example circuit 400 of FIG. 4 are illustrated in FIG. 5 for a transition from CLK low and CLKnot high to CLK high and CLKnot low.

FIG. 6

Sometimes it is desirable that there is a short time delay between opening two switches of the same type that are active in the same phase. This can for instance reduce the effect of signal dependent charge injection (bottom plate sampling).

Figure 6:
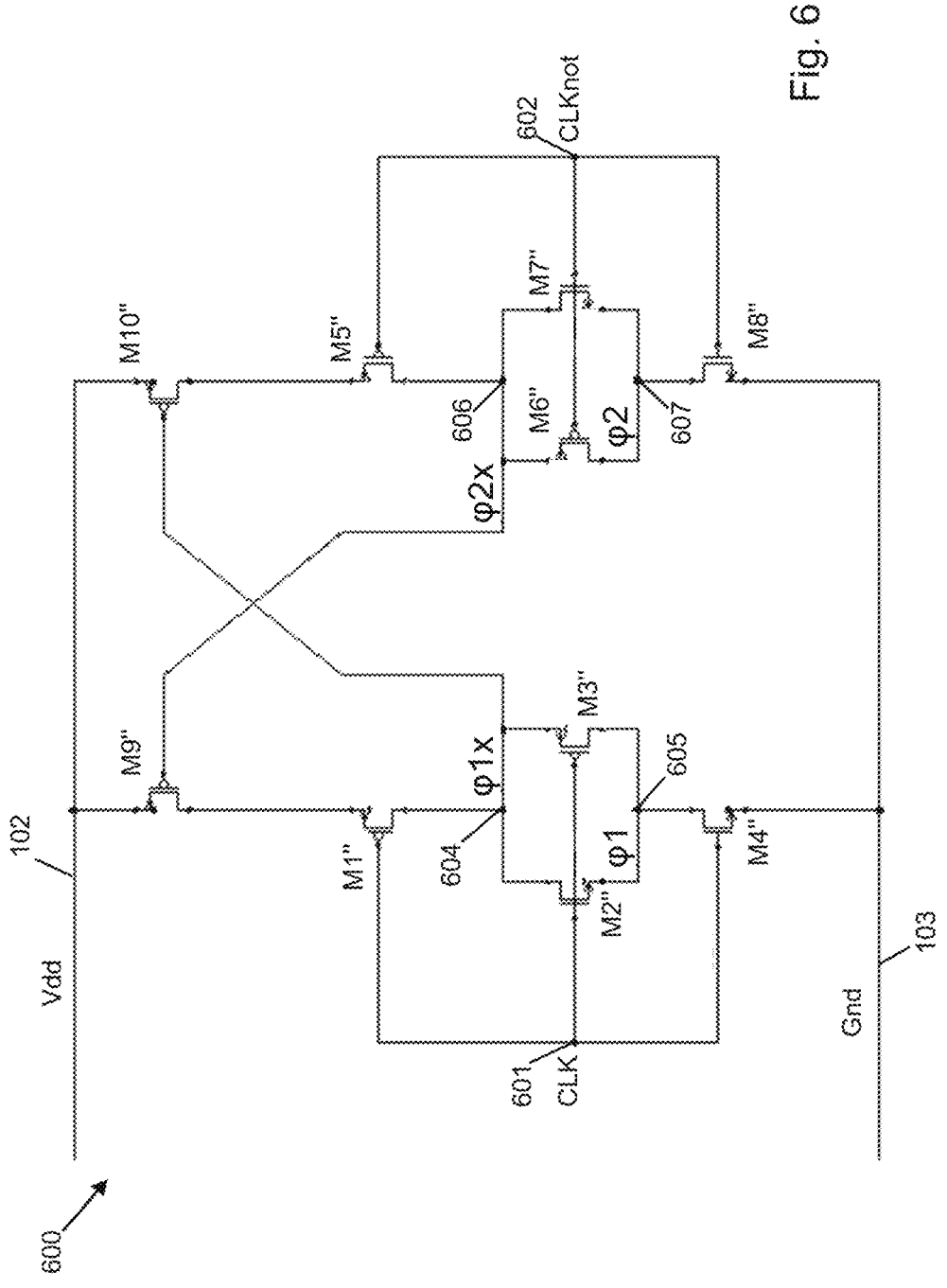
FIG. 6 is a schematic circuit diagram of a fourth example clock signal circuit.

A fourth example clock signal circuit 600 for NMOS switches is illustrated in FIG. 6. In operation of the circuit 600 there is a small time delay between the opening as well as the closing of the switches.

As with the first example, the fourth example clock signal circuit 600 comprises first and second PMOSFETs M1", M3" and first and second NMOSFETs M2", M4". The clock signal input node 601 is connected to a gate of the first PMOSFET M1" and a gate of the second NMOSFET M4".

A first voltage rail 102, which in this case is a supply voltage rail providing a supply voltage Vdd, is connected to a source of the first PMOSFET M1" via a fifth PMOSFET M9". A second voltage rail 103, which in this case is a common or ground rail, is connected to a source of the second NMOSFET M4".

A first clock signal output node 604 is connected to a drain of the first PMOSFET M1", a drain of the first NMOSFET M2" and a source of the second PMOSFET M3".

A second clock signal output node 605 is connected to a drain of the second PMOSFET M3", a source of the first NMOSFET M2" and a drain of the second NMOSFET M4".

The fourth example clock signal circuit 600 comprises third and fourth PMOSFETs M5", M6" and third and fourth NMOSFETs M7", M8". An inverted clock signal input node 602 is connected to a gate of the third PMOSFET M5" and to a gate of the fourth NMOSFET M8".

A third clock signal output node 606 is connected to a drain of the third PMOSFET M5", a drain of the third NMOSFET M7" and a source of the fourth PMOSFET M6".

A fourth clock signal output node 607 is connected to a drain of the fourth PMOSFET M6", a source of the third NMOSFET M7" and a drain of the fourth NMOSFET M8".

The first voltage rail 102 is connected to a source of the third PMOSFET M5" via a sixth PMOSFET M10". The second voltage rail 103 is connected to a source of the fourth NMOSFET M8".

The clock signal circuit 600 comprises fifth and sixth PMOSFETs M9", M10" connected between the first voltage rail 102 and the first and third PMOSFETS M1", M5" respectively. The first voltage rail 102 is connected to sources of the fifth and sixth PMOSFETs M9", M10". A drain of the fifth MOSFET M9" is connected to the source of the first PMOSFET M1". A drain of the sixth PMOSFET M10" is connected to the source of the third PMOSFET M5". A gate of the fifth PMOSFET M9" is connected to the third clock signal output node 606. A gate of the sixth PMOSFET M10" is connected to the first clock signal output node 604.

The clock signal input node 601 is connected to gates of the first NMOSFET M2" and the second PMOSFET M3". The inverted clock signal input node 602 is connected to the gates of the fourth PMOSFET M6" and the third NMOSFET M7".

FIG. 7

Figure 7:
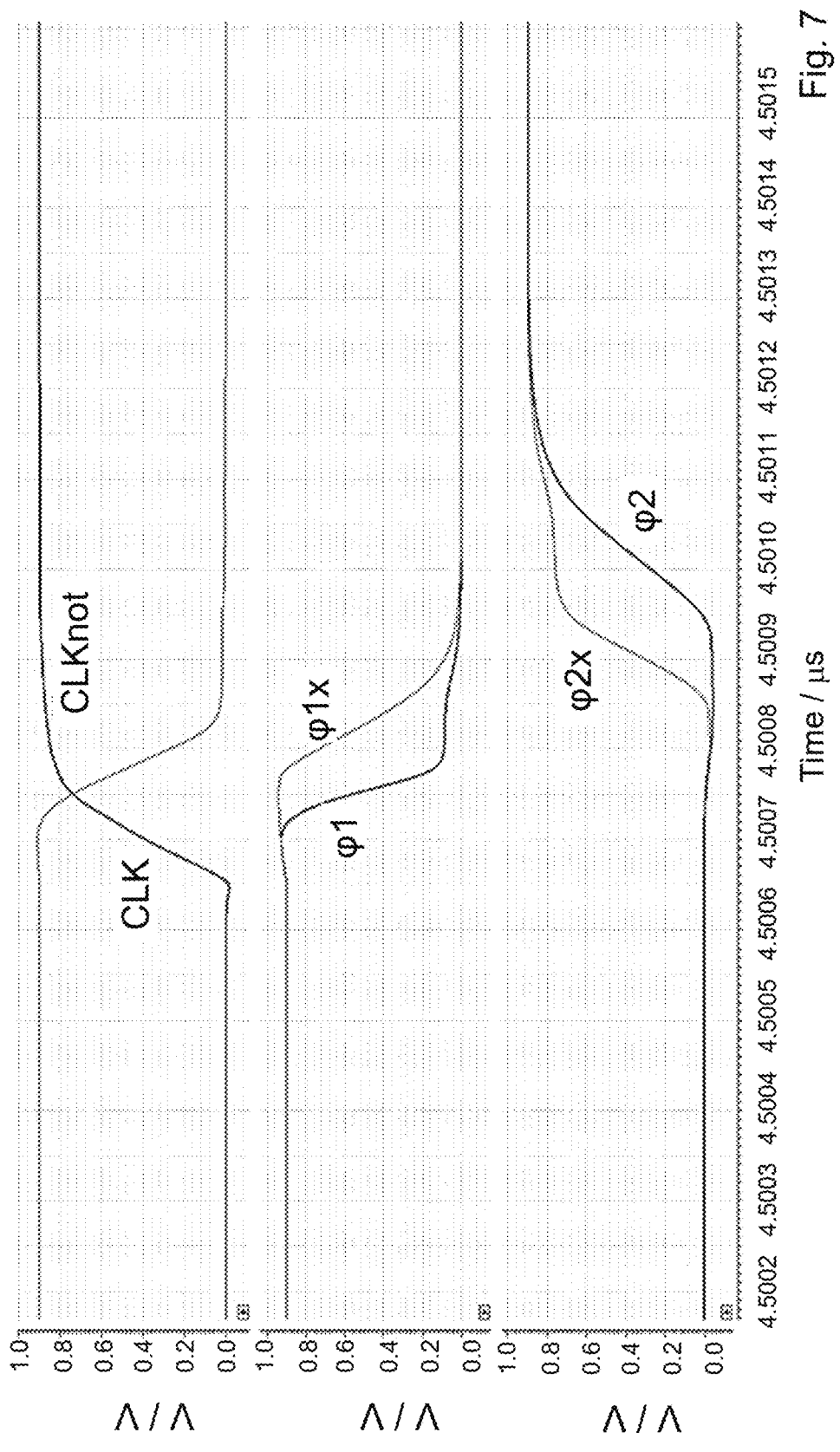
FIG. 7 is a plot of clock phase output signals of the fourth example clock signal circuit over a clock transition.

FIG. 7 illustrates the waveforms for the clock signal circuit 600 of FIG. 6 over a transition from CLK high and CLKnot low to CLK low and CLKnot high. As can be seen, first $\varphi1$ goes low, then $\varphi1_x$. Only when all phase 1 switches (connected to $\varphi1$ or $\varphi1_x$) are opened, the phase 2 switches (connected to $\varphi2$ or $\varphi2_x$) will be closed.

FIG. 8

Figure 8:
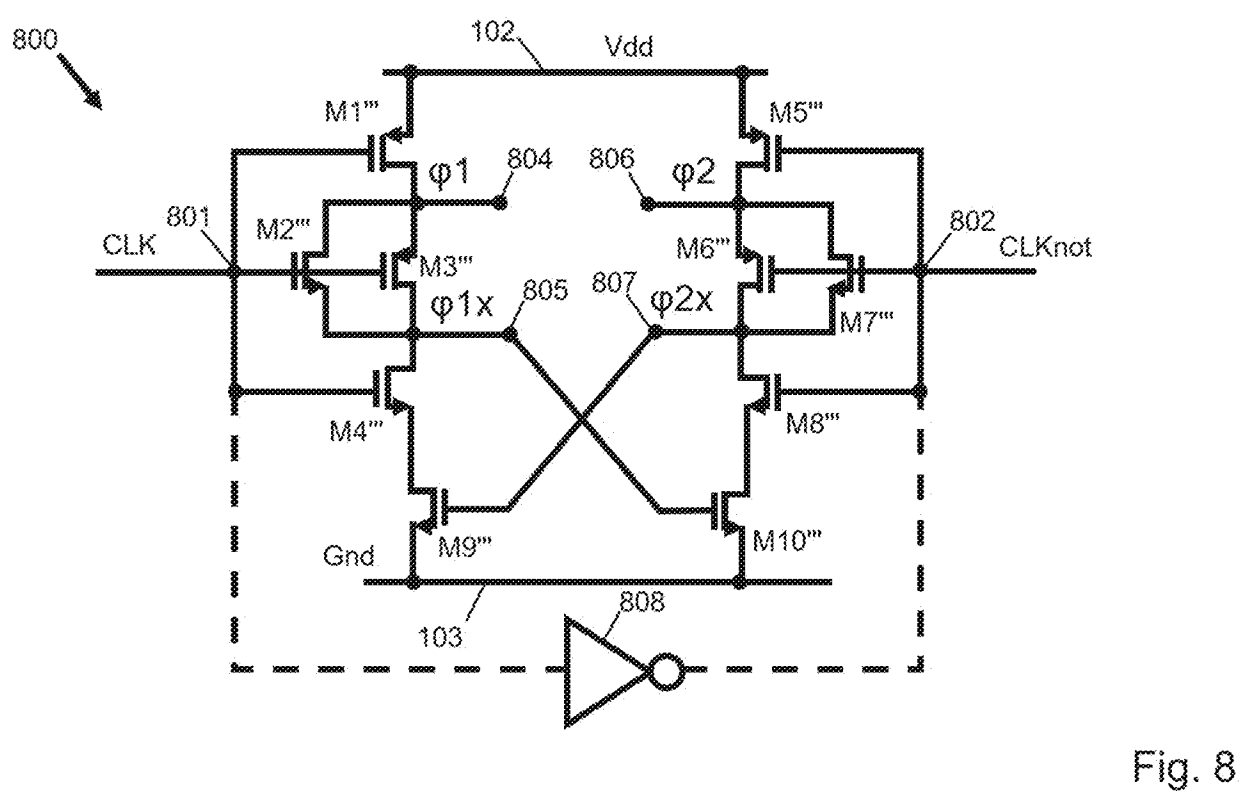

FIG. 8 illustrates a similar circuit to that of FIG. 6 in which fifth and sixth NMOSFETs M9", M10'" are used in place of the fifth and sixth PMOSFETs M9", M10" of the fourth example clock signal circuit of FIG. 6. As with the first example, the fifth example clock signal circuit 800 comprises first and second PMOSFETs M1'", M3'" and first and second NMOSFETs M2'", M4'". The clock signal input node 601 is connected to a gate of the first PMOSFET M1'" and a gate of the second NMOSFET M4'".

A first voltage rail 102, which in this case is a supply voltage rail providing a supply voltage Vdd, is connected to a source of the first PMOSFET M1'". A second voltage rail 103, which in this case is a common or ground rail, is connected to a source of the second NMOSFET M4'" via a fifth NMOSFET M9".

A first clock signal output node 804 is connected to a drain of the first PMOSFET M1'", a drain of the first NMOSFET M2'" and a source of the second PMOSFET M3'".

A second clock signal output node 805 is connected to a drain of the second PMOSFET M3", a source of the first NMOSFET M2'" and a drain of the second NMOSFET M4'".

The fifth example clock signal circuit 800 comprises third and fourth PMOSFETs M5", M6" and third and fourth NMOSFETs M7", M8". An inverted clock signal input node 802 is connected to a gate of the third PMOSFET M5" and to a gate of the fourth NMOSFET M8'".

A third clock signal output node 806 is connected to a drain of the third PMOSFET M5'", a drain of the third NMOSFET M7'" and a source of the fourth PMOSFET M6'".

A fourth clock signal output node 807 is connected to a drain of the fourth PMOSFET M6'", a source of the third NMOSFET M7'" and a drain of the fourth NMOSFET M8". The first voltage rail 102 is connected to a source of the third PMOSFET M5". The second voltage rail 103 is connected to a source of the fourth NMOSFET M8" via a sixth NMOSFET M10".

The fifth and sixth NMOSFETs M9", M10" are connected between the second voltage rail 103 and the second and fourth NMOSFETs M4", M8" respectively. The second voltage rail 103 is connected to sources of the fifth and sixth NMOSFETs M9'", M10'". A drain of the fifth NMOSFET M9'" is connected to the source of the second NMOSFET M4'". A drain of the sixth NMOSFET M10'" is connected to the source of the fourth NMOSFET M5'". A gate of the fifth NMOSFET M9" is connected to the fourth clock signal output node 807. A gate of the sixth NMOSFET M10'" is connected to the second clock signal output node 805.

The clock signal input node 801 is connected to gates of the first NMOSFET M2" and the second PMOSFET M3". The inverted clock signal input node 802 is connected to the gates of the fourth PMOSFET M6'" and the third NMOSFET M7'".

From reading the present disclosure, other variations and modifications will be apparent to the skilled person. Such variations and modifications may involve equivalent and other features which are already known in the art of clock signal circuits, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A clock signal circuit for generating first and second non- overlapping output clock signals, the clock signal circuit comprising:
   first and second PMOSFETS;
   first and second NMOSFETs;
   a clock signal input node connected to a gate of the first PMOSFET and a gate of the second NMOSFET;
   a first voltage rail connected to a source of the first PMOSFET;
   a second voltage rail connected to a source of the second NMOSFET;
   a first clock signal output node connected to a drain of the first PMOSFET, a drain of the first NMOSFET and a source of the second PMOSFET; and
   a second clock signal output node connected to a drain of the second PMOSFET, a source of the first NMOSFET and a drain of the second NMOSFET;
   third and fourth PMOSFETS;
   third and fourth NMOSFETS;
   an inverted clock signal input node connected to a gate of the third PMOSFET and a gate of the fourth NMOS-FET;
   a third clock signal output node connected to a drain of the third PMOSFET, a drain of the third NMOSFET and a source of the fourth PMOSFET; and
   a fourth clock signal output node connected to a drain of the fourth PMOSFET, a source of the third NMOSFET and a drain of the fourth NMOSFET.

2. The clock signal circuit of claim 1, wherein the clock signal input is connected to a gate of the first NMOSFET and a gate of the second PMOSFET.

3. The clock signal circuit of claim 1, comprising:
   a fifth PMOSFET having a gate connected to the first clock signal output node, a source connected to the first voltage rail and a drain connected to an output node; and
   a fifth NMOSFET having a gate connected to the second clock signal output node, a source connected to the second voltage rail and a drain connected to the output node.

4. The clock signal circuit of claim 2, wherein the first voltage rail is a supply voltage rail and the second voltage rail is a common rail.

5. The clock signal circuit of claim 1, wherein:
   the first voltage rail is connected to a source of the third PMOSFET; and
   the second voltage rail is connected to a source of the fourth NMOSFET.

6. The clock signal circuit of claim 5, wherein:

the first clock signal output node is connected to a gate of the third NMOSFET;

the second clock signal output node is connected to a gate of the fourth PMOSFET;

the third clock signal output node is connected to a gate of the first NMOSFET; and the fourth clock signal output node is connected to a gate of the second PMOSFET.

7. The clock signal circuit of claim 6, comprising an inverter having an input connected to the clock signal input node and an output connected to the inverted clock signal input node.

8. The clock signal circuit of claim 5, comprising an inverter having an input connected to the clock signal input node and an output connected to the inverted clock signal input node.

9. The clock signal circuit of claim 5, wherein the first voltage rail is a supply voltage rail and the second voltage rail is a common rail.

10. The clock signal circuit of claim 1, comprising an inverter having an input connected to the clock signal input node and an output connected to the inverted clock signal input node.

11. The clock signal circuit of claim 1, comprising fifth and sixth PMOSFETs connected between the first voltage rail and the first and third PMOSFETs respectively, wherein the first voltage rail is connected to sources of the fifth and sixth PMOSFETs, a drain of the fifth MOSFET is connected to the source of the first PMOSFET, a drain of the sixth PMOSFET is connected to the source of the third PMOSFET, a gate of the fifth PMOSFET is connected to the third clock signal output node, and a gate of the sixth PMOSFET is connected to the first clock signal output node.

12. The clock signal circuit of claim 11, comprising an inverter having an input connected to the clock signal input node and an output connected to the inverted clock signal input node.

13. The clock signal circuit of claim 11, wherein the first voltage rail is a supply voltage rail and the second voltage rail is a common rail.

14. The clock signal circuit of claim 11, wherein:

the clock signal input node is connected to gates of the first NMOSFET and the second PMOSFET; and the inverted clock signal input node is connected to the gates of the fourth PMOSFET and the third NMOS-FET.

15. The clock signal circuit of claim 1, comprising fifth and sixth NMOSFETs connected between the second voltage rail and the second and fourth NMOSFETs respectively, wherein the second voltage rail is connected to sources of the fifth and sixth NMOSFETs, a drain of the fifth PMOS-FET is connected to the source of the second NMOSFET, a drain of the sixth NMOSFET is connected to the source of the fourth NMOSFET, a gate of the fifth NMOSFET is connected to the fourth clock signal output node, and a gate of the sixth NMOSFET is connected to the second clock signal output node.

16. The clock signal circuit of claim 15, wherein:

the clock signal input node is connected to gates of the first NMOSFET and the second PMOSFET; and the inverted clock signal input node is connected to the gates of the fourth PMOSFET and the third NMOS-FET.

17. The clock signal circuit of claim 15, comprising an inverter having an input connected to the clock signal input node and an output connected to the inverted clock signal input node.

18. The clock signal circuit of claim 15, wherein the first voltage rail is a supply voltage rail and the second voltage rail is a common rail.

19. The clock signal circuit of claim 1, wherein the first voltage rail is a supply voltage rail and the second voltage rail is a common rail.

* * * * *